United States Patent [19]

Fukuoka

[11] 4,318,095
[45] Mar. 2, 1982

[54] DIGITAL INPUT APPARATUS
[75] Inventor: Kenji Fukuoka, Fussa, Japan
[73] Assignee: Olympus Optical Co. Ltd., Tokyo, Japan
[21] Appl. No.: 78,609
[22] Filed: Sep. 24, 1979
[30] Foreign Application Priority Data
  Oct. 25, 1978 [JP] Japan .................. 53/131341
[51] Int. Cl.³ .............................. G06F 3/14
[52] U.S. Cl. .................... 340/706; 340/806; 340/810; 318/614
[58] Field of Search ............ 340/380, 810, 347 P, 340/806, 807, 808, 809, 706, 789; 318/614

[56] References Cited
U.S. PATENT DOCUMENTS

| | | | |
|---|---|---|---|
| 3,256,473 | 6/1966 | Simopoulos et al. | 318/614 |
| 3,721,806 | 3/1973 | Stothart | 340/347 P |
| 3,913,095 | 10/1975 | Dlugos | 340/347 P |
| 4,015,253 | 3/1977 | Goldstein | 340/810 |
| 4,194,184 | 3/1980 | Hartmann et al. | 340/347 P |

*Primary Examiner*—Marshall M. Curtis
*Attorney, Agent, or Firm*—Weinstein & Sutton

[57] ABSTRACT

Switch apparatus having a digital display is provided in accordance with the teachings of the present invention. The switch apparatus according to the present invention includes an encoder having a code pattern thereon which is scanned by a reader to produce multi-bit binary information to be displayed. A storage circuit having switch positional information stored therein is also provided and a collator is employed to compare the multi-bit binary information read by the reader with the positional information stored in the storage circuit. When a comparison is obtained a braking force is applied to inhibit scanning so that a switch position corresponding to stored positional information is obtained.

17 Claims, 8 Drawing Figures

DIGITAL INPUT APPARATUS

BACKGROUND OF THE INVENTION

The invention relates to a switch with a digital display, and more particularly, to such a switch may be used as input means for supplying reference information to a digital circuit such as a digital controller, a microcomputer or the like.

A variety of switches including rotary switches, and pushbutton switches are used for inputting numerical reference information into a digital circuit. For example, a thumbwheel switch is known as one form of a rotary switch, and includes a thumbwheel having decimal numbers "0" to "9" borne thereon. By turning the thumbwheel so that one of the numbers is selectively brought to a home position where the number is displayed, a corresponding decimal digit is supplied as an input from the switch at the same time as it is displayed. A plurality of such thumbwheel switches may be combined to supply a multi-digit decimal number as an input and also to display such number.

However, where a plurality of such thumbwheel switches are used in combination to input and display a multi-digit decimal number, it will be understood that unnecessary number or numbers may be temporarily displayed and inputted when simultaneously changing the multiple digits to another desired sequence. By way of example, when switching the display of a two-digit number from "19" to "20", the switching operation which takes place for each digit causes unnecessary numbers such as "10" or "29" to be temporarily displayed and inputted in the course of such operation.

To overcome such an inconvenience, a read circuit is provided which, instead of instantly reading the numerical value indicated by the thumbwheel switches, is responsive to the operation of an input enable switch, which is actuated after the completion of operating the thumbwheel switches, so that the desired new value can be read unambiguously. However, it will be appreciated that such an arrangement results in a complication of the switching mechanism and the read circuit as well as a troublesome operation on the part of an operator.

On the other hand, when a pushbutton switch arrangement which is used in a table-top electronic calculator is used as means for inputting numeral reference information, an inconvenience results when the power supply is interrupted such that information is lost which indicates which button or buttons have been depressed. If it is desired to prevent such an inconvenience, it is necessary to provide a separate charging unit which is normally maintained charged so that in the event a power supply is interrupted, it feeds a storage element or elements to prevent the loss of information stored therein. Alternatively, a non-volatile memory such as EAROM (electrically alterable read only memory) may be provided to store numerical information therein before the power supply is interrupted. However, the provision of a charging unit or non-volatile memory also results in a complication of the switching arrangement and the read circuit. In addition, the use of a non-volatile memory requires a troublesome switch operation in that numerical information must be inputted into the memory before the power supply is interrupted.

From the foregoing discussions, it will be appreciated that the use of conventional means which involves thumbwheel switches or pushbutton switches is not adequate for use as means for inputting numerical reference information into a digital circuit such as a digital controller, digital computer or the like, which require an accurate and rapid inputting of numerical reference information, and which must maintain the condition of switches which they assumed before the interruption of the power supply.

SUMMARY OF THE INVENTION

It is an object of the invention to provide a switch apparatus with a digital display including an encoder having a coded pattern which is scanned by a reader to produce a multi-bit binary information signal which is then displayed in a digital manner, and a storage circuit is provided to store positional information of the encoder as a numerical information, signal which is then compared with the binary information signal read by the reader to enable a collator to produce a coincidence output when the both signals coincide with each other, thereby enabling brake means to retain either the encoder or the reader at the corresponding position.

With the switch apparatus of the invention, it is a simple matter to change the location or number of switching positions by merely changing the content and number of positional information which is stored in the storage circuit. Such change can be achieved simply by varying the content stored in the storage circuit without modifying the mechanical arrangement of the switch apparatus. The position of the switch before the power supply is interrupted is maintained after the interruption of the power supply, thus avoiding its erasure. A single switch can be used to change multiple digits, and unnecessary numerical information cannot be inputted during the a changing in the condition of the switch.

DESCRIPTION OF PREFERRED EMBODIMENTS

Figure 1:
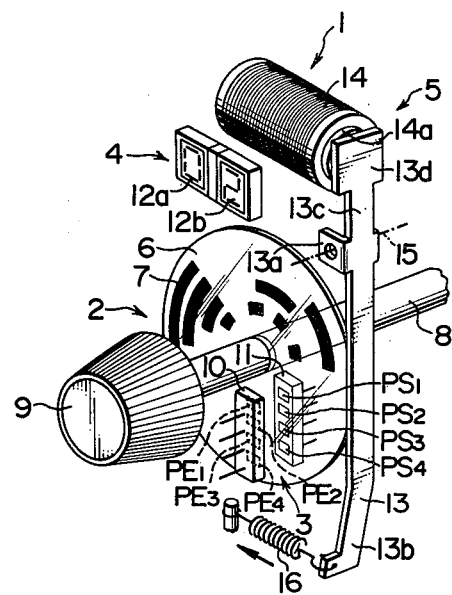
FIG. 1 is a perspective view of a switch with a digital display according to one embodiment of the invention.

Referring to FIG. 1, there is shown switch apparatus 1 with digital display 4 which is constructed in accordance with one embodiment of the invention. Specifically, switch 1 comprises encoder 2, reader 3, display 4 and brake assembly 5.

Figure 2:
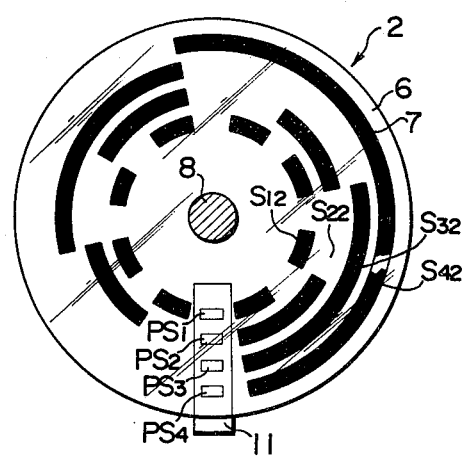
FIG. 2 is a front view of an encoder of the switch apparatus shown in FIG. 1.

Encoder 2 includes code disc 6 which may be formed from a transparent synthetic resin such as acrylic resin. Coded pattern 7 is formed on the surface of code plate 6 as by printing or engraving. As shown in FIG. 2, code pattern 7 is formed by four concentric, annular regions which are radially spaced apart at an equal spacing and which are divided into 16 segments by 16 radially extending lines which meet at the center of plate 6, thus forming $4 \times 16 = 64$ subregions $S_{ij}$ ($i = 1$ to 4, $j = 0$ to 15). The suffix $i$ is numbered in the sequence of the innermost to the outermost region while the suffix $j$ is numbered in the counter-clockwise direction. A set of radially aligned subregions $S_{1j}$ to $S_{4j}$ define a 4-bit binary number which is indicated by the truth table below. A particular segment of any subregion which corresponds to binary 0 in the truth table is formed by an opaque area. In this manner, coded pattern 7 shown indicates binary numbers from "0000" to "1111", which correspond to decimal numbers from 0 to 15.

Truth Table

| j | i=1 | 2 | 3 | 4 |
|---|---|---|---|---|
| 0 | 0 | 0 | 0 | 0 |
| 1 | 0 | 0 | 0 | 1 |
| 2 | 0 | 0 | 1 | 0 |
| 3 | 0 | 0 | 1 | 1 |
| 4 | 0 | 1 | 0 | 0 |
| 5 | 0 | 1 | 0 | 1 |
| 6 | 0 | 1 | 1 | 0 |
| 7 | 0 | 1 | 1 | 1 |
| 8 | 1 | 0 | 0 | 0 |
| 9 | 1 | 0 | 0 | 1 |
| 10 | 1 | 0 | 1 | 0 |
| 11 | 1 | 0 | 1 | 1 |
| 12 | 1 | 1 | 0 | 0 |
| 13 | 1 | 1 | 0 | 1 |
| 14 | 1 | 1 | 1 | 0 |
| 15 | 1 | 1 | 1 | 1 |

Referring to FIG. 1, code plate 6 is fixedly mounted on rotary shaft 8 which passes through the center thereof. Knob 9 is fixedly mounted on the front end of shaft 9 for operating code plate 6.

Reader 3 comprises a set of four light emitting elements $PE_1$ to $PE_4$ and another set of light receiving elements $PS_1$ to $PS_4$ which are disposed along a selected radius of plate 6 on the opposite sides thereof. It will be seen that these elements are mounted on support members 10, 11, rspectively so that the individual elements are aligned with the annular regions $S_{1j}$ to $S_{4j}$.

The elements $PE_1$ to $PE_4$ and $PS_1$ to $PS_4$ are activated to emit light and to be responsive to light incident thereon as soon as switch 1 is fed from a power supply. A light receiving element which is opposed to a transparent one of subregions $S_{1j}$ to $S_{4j}$ produces a high level output in response to light which impinges thereon from its associated light emitting element. A light receiving element which is disposed in opposing relationship with an opaque one of subregions $S_{1j}$ to $S_{4j}$ receives no light input, and hence produces a low level outputs. The low level and the high level output from light receiving elements $PS_1$ to $PS_4$ can be considered as representing binary 0 and binary 1, and hence the outputs of the four elements $PS_1$ to $PS_4$ represents a 4-bit binary code which is read from coded pattern 7.

Figure 3:
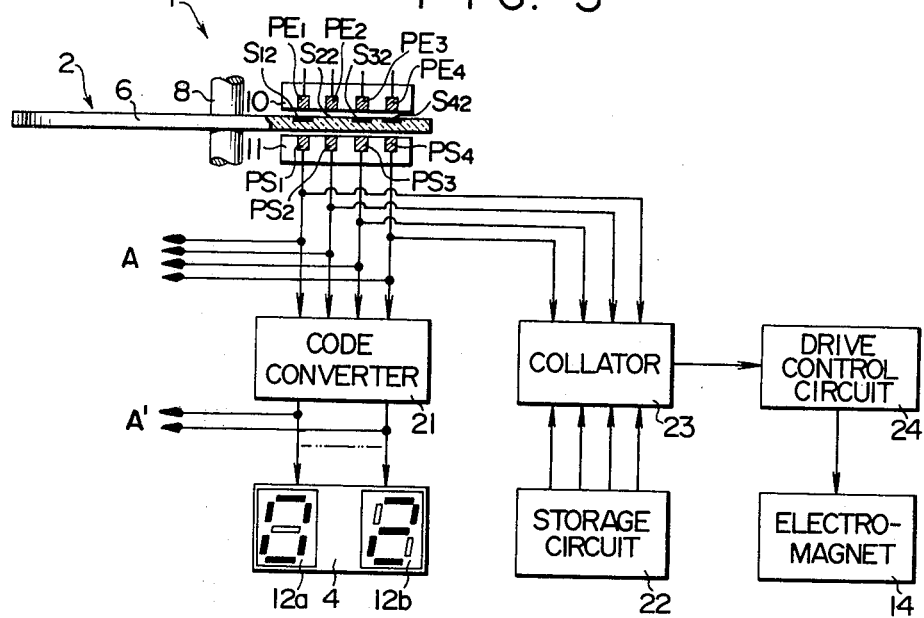
FIG. 3 is a block diagram illustrating the electrical circuit associated with the switch shown in FIG. 1.

Display 4 comprises a pair of 7-segment display elements 12a, 12b which are juxtaposed with each other for displaying a two-digit decimal number. As shown in FIG. 3, the display 4 is driven by an output from code converter 21 which may comprise a conventional decoder/driver. As is evident, code converter 21 receives four bits of information which appear at the outputs of light receiving elements $PS_1$ to $PS_4$ of reader 3, and converts them into a corresponding 16 bit output. The most significant eight bits of which are supplied as a drive signal for higher digit display element 12a while the least significant eight bits of which are supplied as a drive signal for the lower digit display element 12b.

Brake assembly 5 comprises brake lever 13 which is disposed adjacent to code plate 6 for selectively contacting a peripheral edge thereof to thereby apply a braking force thereto. An electromagnet 14 is disposed adjacent to code plate 6 for causing brake lever 13 to rock to thereby release code plate 6.

Brake lever 13 carries support 13a in the form of a folded piece which is located toward the upper end thereof and which is pivotally mounted on pin 15 that is fixedly mounted on a stationary member, not shown, of switch 1. It also includes arm 13b which extends close to the peripheral edge of code plate 6, and coiled, tension spring 16 extends between the free end of arm 13b and a stationary member of switch 1, thus urging brake lever 13 to move clockwise about pin 15. However, the resulting angular movement of brake lever 13 is normally blocked by the abutment of an intermediate portion of arm 13b against the peripheral edge of code plate 6, whereby code plate 6 is braked. It is to be understood that this braking force is of a magnitude which is low enough to permit a rotation of code plate 6 by causing the latter to slip against brake lever 13 if knob 9 is forcibly turned with an increased force.

Brake lever 13 also includes another arm 13c which extends upwardly, carrying armature piece 13d of an increased area on is free end. Armature piece 13d is disposed at a suitable spacing from attracting end 14a of electromagnet 14. When electromagnet 14 is energized, armature piece 13d is attracted to the end 14a, thus moving brake lever 13 away from code plate 6 to permit the latter to rotate.

As shown in FIG. 3, electromagnet 14 is deenergized in response to a coincidence signal which is produced by drive control circuit 24 whenever collator 23 determines that positional information read by light receiving elements $PS_1$ to $PS_4$ collates or matches with one set of a plurality of positional information sets which are previously stored in storage circuit 22 comprising ROM (read only memory). When electromagnet 14 is deenergized, a braking force is applied to code plate 6 through brake lever 13, thus stopping code plate 6 at one of the positions stored in storage circuit 22. The corresponding position is digitally displayed by display 4.

In operation, when switch 1 is fed from a power supply, light emitting elements $PE_1$ to $PE_4$ emit light, which is received by light receiving elements $PS_1$ to $PS_4$ of reader 3. Assuming that subregions $S_{12}$ to $S_{42}$ of coded pattern 7 which represent a binary number "0010" are being scanned by reader 3 (see FIG. 3), elements $PS_1$ to $PS_4$ outputs read information "0010". This information is fed to both code converter 21 and collator 23. Information supplied to code converter 21 is converted into 16-bit output "7E6D" which selectively energizes the respective segments of display elements 12a and 12b for illumination. As mentioned previously, the most significant eight bits are supplied to the upper digit display element 12a, which then displays "0" while the least significant eight bits are supplied to the lower digit display element 12b, which then displays "2". This permits an operator to know that the operative position of switch 1 is located at a position corresponding to a decimal number 2.

As known in the art, the output of the switch may take various forms, such as shown in FIG. 3, wherein reference information in the form of outputs A or A' from the switch are supplied or inputted into a digital circuit, such as a digital controller, microcomputer, or the like to supply reference information thereto.

The information fed from light receiving elements $PS_1$ to $PS_4$ to collator 23 is compared against each set of a plurality of positional information sets which is previously stored in storage circuit 22. When a matching occurs, a coincidence signal is fed from collator 23 to drive control circuit 24, which then deenergizes electromagnet 14. Thereupon, armature piece 13d of control lever 13 is no longer attracted to the electromagnet, but is biased clockwise by the resilience of coiled spring 16, thus braking code plate 6.

If the read information does not match or coincide with any information stored in storage circuit 22, collator 23 does not output a coincidence signal, and hence drive control circuit 24 continues to energize electromagnet 14, permitting a rotation of code plate 6.

Code plate 6 can be rotated by turning knob 9 with a force which overcomes a braking force applied thereto or with a reduced force if no braking force is applied to code plate 6. As code plate 6 rotates, adjacent subregions $S_{11}$ to $S_{41}$ or $S_{13}$ to $S_{43}$ will move into registration with reader 3. Thus, read information from reader 3 will change to "0001" or "0011", which is fed to code converter 21 and collator 23. Collator 23 converts this information into 16 bit display outputs "7E30" or "7E79", whereby display element 12a indicates "0" while display element 12b indicates either "1" or "3".

On the other hand, collator 23 successively compares the read information against a plurality of sets of positional information stored in circuit 22. If a matching occurs, collator 23 produces a coincidence signal, which enables drive control circuit 24 to deenergize electromagnet 14. Thereupon, coiled spring 16 is effective to bias brake lever 13 into abutment against code plate 6, thus braking it. The fact that the code plate is braked enables an operator to know that this position is one of those stored in the storage circuit, which is indicated by the numerals on the display. If the read information does not match with any one of the sets of positional informations stored in storage circuit 22, electromagnet 14 is energized, removing a braking force from code plate 6. This permits an operator to recognize that the current position does not match with any one of the sets of positional information in storage circuit 22, and hence the operator may continue to turn the switch with a reduced force to a position where encoder 6 is braked.

It will be understood that by changing the number or content of positional information previously stored in storage circuit 22, a maximum amount of information can be read from switch 1 of the present embodiment. Alternatively the number and location can be changed at will. Where the location is changed, it is only necessary to change the stored content of storage circuit 22 without modifying the mechanical portion of switch 1. When the power supply to switch 1 is restored after it is once interrupted, the operative position which switch 1 assumed before the interruption of the power supply is displayed by display 4.

Figure 4:
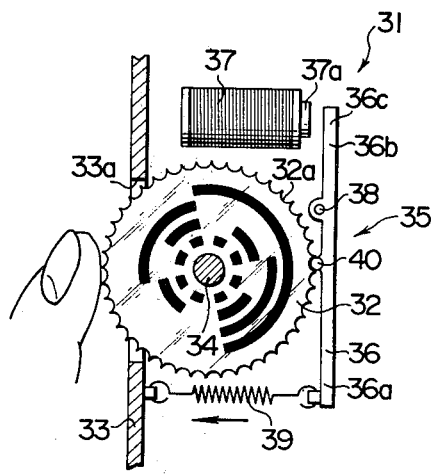
FIGS. 4 to 6 are schematic side elevations of other embodiments of the invention.

FIG. 4 shows a side elevation of a switch with digital display according to another embodiment of the invention. Switch 31 shown is not provided with knob 9 shown in FIG. 1, but includes code plate 32 which has its peripheral edge knurled so as to be operated upon with a finger. Specifically, peripheral edge of code plate 32 is formed with a succession of contiguous semi-circular recesses 32a, and is partly exposed externally of panel 33 through elongate slot 33a formed therein. Code plate 32 is rotatably mounted on rotary shaft 34.

Switch 31 includes brake assembly 35 which comprises brake lever 36 disposed in a vertical orientation adjacent to code plate 32 on the rear side thereof, and electromagnet 37 which is disposed horizontally above code plate 32. Brake lever 36 is pivotally mounted on pin 38 which is located toward the upper end of lever 36. Brake lever 36 includes arm 36a which extends downwardly and which has a free end engaged with one end of coiled tension spring 39, the other end of which is anchored to panel 33, whereby it is urged to rotate clockwise about pin 38. Brake lever also includes another arm 36b, the free end of which represents armature piece 36c which is disposed at a suitable spacing from attracting end 37a of electromagnet 37. Arm 36a of brake lever 36 has ball 40 fixedly mounted thereon to project from the surface of lever 36 which faces code plate 32 at an elevation which is substantially aligned with rotary shaft 34 of code plate 32. The ball 40 can be moved into engagement with one of recesses 32a formed in the peripheral edge of code plate 32 to provide a click-stop assembly. It is to be understood that the reader and the display of switch 31 are not shown in FIG. 4 and that switch 31 can be controlled by a similar electrical circuit as shown in FIG. 3.

The embodiment of FIG. 4 provides the same function and effect as provided by switch 1 shown in FIG. 1. In addition, the cooperation of recesses 32a and ball 40 provides a clicking response to hand at a position where code plate 32 stops.

Figure 5:
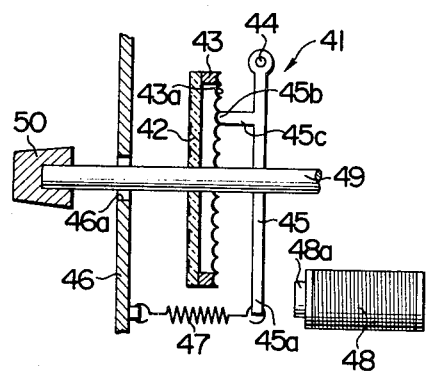

FIG. 5 shows another embodiment of the invention in side elevation. Switch 41 shown is a modification of switch 1 shown in FIG. 1 in that instead of applying a braking force to the peripheral edge of code plate 6, code plate 42 of switch 41 fixedly carries brake ring 43 on its rear side along its periphery so as to avoid an overlapping relationship with a coded pattern (not shown) thereon, with a succession of contiguous semicircular recesses 43a formed in the rear surface of ring 43.

Brake member 45 is disposed rearwardly of brake ring 43 and has its upper end pivotally mounted on pin 44. The lower, free end of member 45 is engaged with one end of coiled tension spring 47, the other end of which is anchored to panel 46. The free end is also formed as armature piece 45a which is disposed at a suitable spacing from attracting end 48a of electromagnet 48. Toward the upper end of braking member 45, brake arm 45c extends forwardly therefrom and has a free end which is shaped as semi-circular projection 45b which fits in one of relesses 43a formed in brake ring 43. Code plate 42 is fixedly mounted on rotary shaft 49, which extends through opening 46a formed in panel 46 to project forwardly thereof, with knob 50 fixedly mounted on its free end. It should be understood that the coded pattern, the reader and the display of switch 41 are omitted from illustration in FIG. 5, and that switch 41 can be controlled by a similar circuit as shown in FIG. 3. It will be apparent that switch 41 operates in the same manner as switch 31 shown in FIG. 4.

Figure 6:
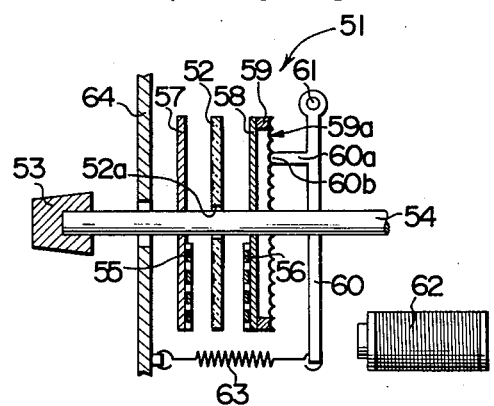

FIG. 6 shows a side elevation of a further embodiment of the invention. Specifically, switch 51 shown is a modification of switch 41 shown in FIG. 5 in that while the reader is fixedly located and code plate 42 is rotated in FIG. 5 to permit a scanning of a coded pattern, in FIG. 6, code plate 52 is fixedly located while a reader is rotated to scan a coded pattern.

Code plate 52 is secured to a stationary member, not shown, of switch 51, and is centrally formed with an opening 52a through which extends rotary shaft 54 having knob 53 fixedly mounted on the free end thereof. Light emitting elements 55 and light receiving elements 56 which constitute together a reader are fixedly mounted on respective carriers 57, 58, which are mounted on rotary shaft 54 on the opposite sides of code plate 52. It will be noted that elements 55 are disposed on the rear surface of carrier 57 while elements 56 are mounted on the front surface of carrier 58 so that they are located in opposing relationship with each other. While not shown, carriers 57, 58 are provided with electrodes which permit the elements 55 to be fed through brush means, not shown, or read information to be taken out of the reader. The rear surface of carrier 58 is provided with annular ring 59 which cooperates with projection 60b formed at the front end of brake arm 60a extending from brake member 60, which is in turn constructed in the same manner as in FIG. 5.

In FIG. 6, numeral 61 represents a pin on which brake member 60 is pivotally mounted, 62 an electromagnet, 63 a coiled spring and 64 a panel, all of which correspond to those components shown in the previous embodiments. The coded pattern and the display are omitted from the illustration. Furthermore, the embodiment may be controlled by an electrical circuit such as shown in FIG. 3.

In operation, as knob 53 is turned, the reader is angularly driven to scan a coded pattern on code plate 52 which is stationary. In other respects, the operation of this embodiment is similar to that of switch 41 shown in FIG. 5.

Figure 7:
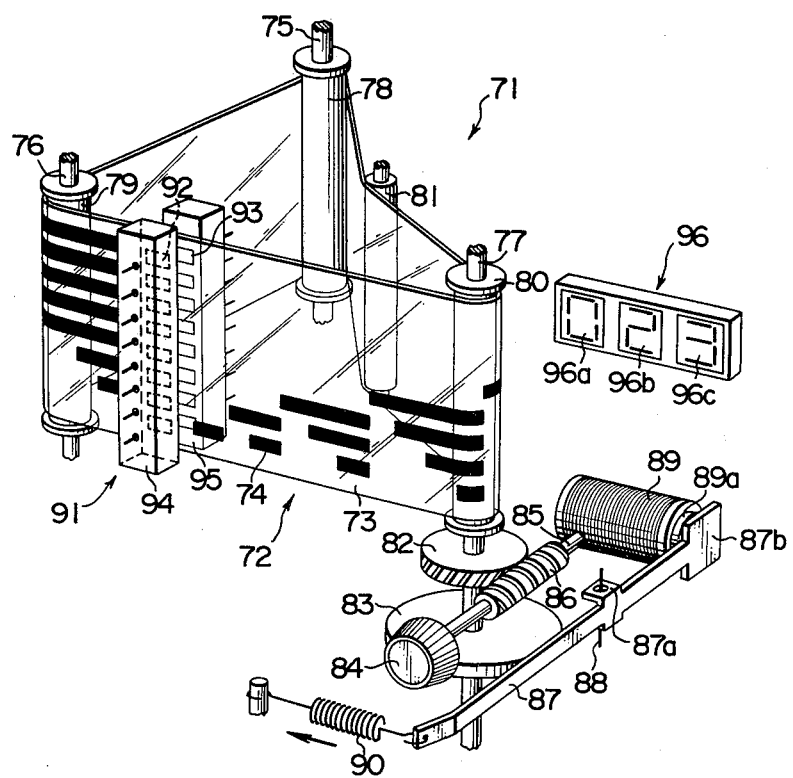
FIGS. 7 and 8 are perspective views of further embodiments of the invention.

Referring to FIG. 7, there is shown still another embodiment of the invention. While in the preceding embodiments, the code plate is formed of a transparent disc on which a coded pattern is formed, switch 71 of FIG. 7 comprises a transparent sheet carrying a coded pattern thereon and which is shaped into a closed loop.

Specifically, switch 71 includes encoder 72 which comprises code sheet 73 formed of a material such as transparent, glass fiber reinforced vinyl, Teflon, Mylar (both trademarks), carrying opaque subregions thereon which may be printed on the surface of code sheet 73 so as to form coded pattern 74. As shown, the opposite ends of sheet 73 are connected together to form an endless loop. Code sheet 73 extend around conveyor rollers 78, 79, and 80 which are fixedly mounted on three support shafts 75, 76, 77 which are in turn rotatably mounted on a stationary member of switch 71 and which are located to define the three apices of a triangle, as viewed in a plan view, with tension roller 81 bearing against the sheet intermediate the rollers 78 and 80 to maintain the sheet taut.

Coded pattern 74 comprises eight regions which are spaced apart crosswise of the sheet at equal intervals, and each of these regions is divided by a multiplicity of crosswise extending lines which are spaced apart at an equal interval along the length of the sheet and which are equal in number to $2^8 = 256$, thus dividing the entire area of the sheet into $8 \times 256 = 2048$ subregions. A set of crosswise eight aligned subregions define an eight bit binary number from "00000000" to "11111111". A subregion which is to represent a binary 0 is formed by an opaque material. In this manner, pattern 74 represents decimal numbers from 0 to 255.

Support shaft 77 represents a drive shaft for running code sheet 73. Specifically, its lower end projects below conveyor roller 80 and fixedly carries worm wheel 82 and brake disc 83. Worm wheel 82 meshes with worm gear 86 which is mounted on rotary shaft 85 having knob 84 fixedly mounted on its free end. By turning knob 84, the rotation is transmitted through worm gear 86 and worm wheel 82 to support shaft 77 for conveying code sheet 73. Brake lever 87, which is constructed in the same manner as brake lever 13 shown in FIG. 1, is disposed in a horizontal position adjacent to the peripheral edge of brake disc 83. Toward its rear end, brake lever 87 is formed with folded piece 87a which is pivotally mounted on pin 88 which is fixedly supported by a stationary member. Coiled tension spring 90 extends between a stationary member and the front end of brake lever 87 for normally urging brake lever 87 clockwise about pin 88 so that its intermediate portion bears against the peripheral edge of brake disc 83 to prevent its rotation. In this manner, a breaking force is applied to support shaft 77 through brake disc 83. The other or rear end of brake lever 87 is formed as armature piece 87b which is disposed at a suitable spacing from attracting end 89a of brake release electromagnet 89.

A set of eight light emitting elements 92 and a set of eight light receiving elements 93 constitute together reader 91, and are disposed on the opposite sides of code sheet 73 in its region extending between conveyor rollers 79 and 80. These elements are fixedly carried by respective carriers 94, 95 and are disposed in opposing relationship with each other, with eight regions of the loop interposed therebetween.

Because coded pattern 74 represent decimal numbers from 0 to 255 in the switch 71 of the present embodiment, display 96 includes three 7-segment display elements 96a, 96b, 96c which are juxtaposed with each other. A code converter, not shown, receives read information from eight elements 93 and converts it into a three digit decimal number for the display output. To this end, it converts an eight bit input into a 24 bit output. A collator, not shown, is arranged to effect eight bit comparison.

It is to be understood that the transparent sheet may have its leading edge anchored to a take-up roller while its trailing end secured to a supply roller so that the code sheet may be passed from one of the rollers to the other.

This embodiment advantageously enables a switch of small size to provide for an increased number of bits by the use of a transparent code sheet. By contrast, if it is desired to increase the number of bits in the coded pattern with the previous embodiments, the size of the code plate will have to be increased by a geometrical progression.

Figure 8:
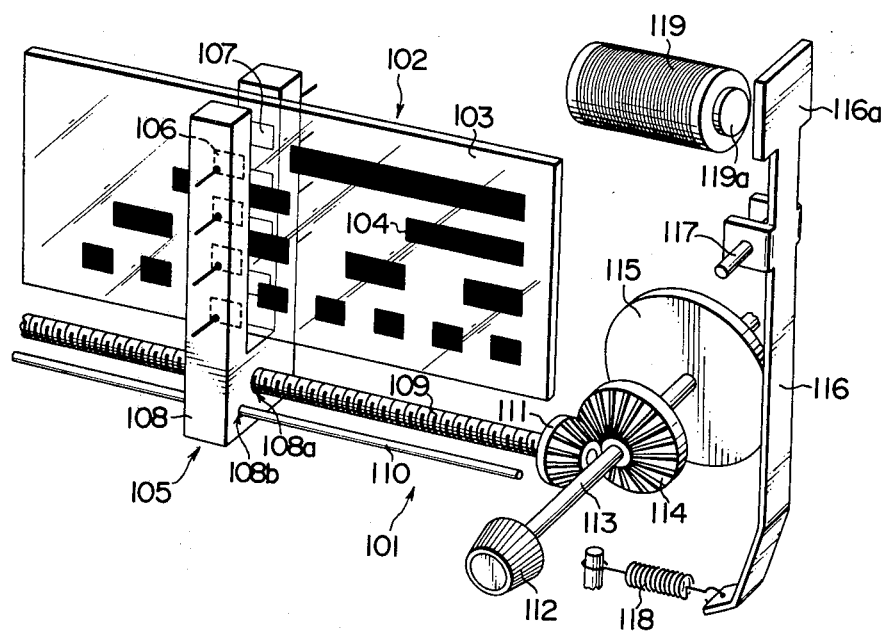

FIG. 8 shows an additional embodiment of the invention. Switch 101 shown is a modification of switch 71 shown in FIG. 7 in that its reader 105 is arranged for translational movement to scan coded pattern 104, in contrast to the stationary reader 91 of FIG. 7.

Specifically, switch 101 includes encoder 102 which comprises rectangular code plate 103 formed of a transparent synthetic resin such as acrylic resin and carrying coded pattern 104 which is formed by opaque subregions formed on the surface of code plate 103 as by printing or engraving. Coded pattern 104 comprises four regions extending lengthwise of code plate 103 and which are equidistantly spaced apart crosswise thereof, each of these regions being lengthwise equally divided into 16 segments, thus defining 256 subregions. As before, a set of crosswise aligned four subregions define a four bit binary number from "0000" to "1111". A subregion corresponding to a binary 0 is defined by an opaque subregion. In this manner, pattern 104 represents decimal numbers from 0 to 15.

Reader 105 comprises a set of four light emitting elements 106 and a set of four light receiving elements 107 which are disposed in opposing relationship with each other on the opposite sides of code plate 103. These elements are carried by the opposing inner surfaces of both limbs of U-shaped support member 108. The base of support member 108 is formed with threaded hole 108a and guide hole 108b which extend in a direction parallel to the length of code plate 103. A feed screw 109 having a substantial length is engaged with and passed through threaded hole 108a while guide member 110, in the form of a round rod is passed through guide hole 108b. Bevel gear 111 is fixedly mounted on the free end of feed screw 109, and meshes with another bevel gear 114 which is mounted on rotary shaft 113 intermediate its length. The free end of shaft 113 carrying knob 112. By turning knob 112, the rotation is transmitted through both bevel gears 111, 114 to feed screw 109, which then moves support member 108 in the horizontal direction along guide member 110, thus scanning coded pattern 104.

Brake disc 115 is fixedly mounted on the rear end of rotary shaft 113, and brake lever 116, which is constructed in the same manner as brake lever 13 shown in FIG. 1, is pivotally mounted on pin 117 and located adjacent to the peripheral edge of brake disc 115. Coiled tension spring 118 extends between a stationary member and the lower end of brake lever 116 while the other end of brake lever 116 is formed as armature piece 116a disposed at a given spacing from attracting end 119a of electromagnet 119, all in the same manner as mentioned previously in connection with brake lever 13.

With this embodiment, knob 112 may be turned to cause a translational movement of reader 105 to scan coded pattern 104 on the stationary code plate 103. In other respects, the operation is similar to the operation of various embodiments mentioned above in connection with FIGS. 1 to 6.

It should be understood that in the preceding embodiments, a coded pattern is formed by transparent subregions of the code plate and opaque subregions so as to be optically read by the reader, but that a coded pattern may be formed of electrically conductive and non-conductive subregions so as to be electrically read by a corresponding reader. Alternatively, a coded pattern may also be formed as a magnetic pattern for cooperation with a magnetic reader.

Also, the brake means has been constructed with an electromagnet and a brake member which has its end adapted to be attracted to the electromagnet and disposed for abutment or fitting engagement with either the encoder or the reader in the previous embodiments. However, the encoder or the reader may be braked by any other means than the abutment or fitting engagement, such as the pressing action or an arrangement in which a member intended to be braked is held between associated braking members.

Furthermore, while a storage circuit has been described as comprising ROM, it may comprise EAROM (electrically alterable read only memory) or the like so that positional information can be externally programmable in a simple manner.

Finally, instead of a binary notation used to construct the coded pattern, Gray code may also be similarly used. When this code is used, the least bit of a binary number which corresponds to a decimal number 2, for example, may change from "0" to "1" due to the noises, but the resulting change in the decimal number is only one, namely, to decimal number 3, thus preventing an erroneous number from being produced which is greatly displaced from the original number.

What is claimed is:

1. Switch apparatus, comprising:
    encoder means having a code pattern thereon defining a plurality of digital codes which are a function of locations on said encoder means at which said code pattern is read;
    reader means for scanning selected locations on said encoder means and for producing a multi-bit binary output from the portion of said code pattern read therefrom;
    display means for receiving said multi-bit binary output to cause a representation thereof to be displayed;
    storage means for storing positional information corresponding to selectable positions of said switch apparatus;
    means for comparing positional information stored in said storage means with said multi-bit binary output from said reader means, said means for comparing producing a comparison indication whenever a condition of comparison obtains; and
    brake means responsive to said comparison indication from said means for comparing for applying a braking force to said encoder means.

2. The switch apparatus according to claim 1 wherein said encoder means comprises a transparent code disc having a code pattern concentrically formed on the surface thereof.

3. The switch apparatus according to claim 1 wherein said encoder means comprises a transparent code sheet having a code pattern formed thereon in a longitudinal direction, said transparent code sheet being formed in a closed loop.

4. The switch apparatus according to claim 1 wherein said encoder means comprises a rectangular, transparent code plate having a coded pattern formed thereon in a direction parallel to one side of said plate.

5. The switch apparatus according to claim 1 wherein said reader means comprises a plurality of light emitting and light receiving elements equal in number to the number of bits in said multi-bit binary output, said reader means acting to optically read said code pattern.

6. The switch apparatus according to claim 5 wherein said light emitting elements and said light receiving elements are disposed in an opposing relationship on opposite sides of said encoder means, said encoder means comprising a transparent disc having said code pattern formed thereon by transparent and opaque subregions, said code pattern being optically read by said reader means.

7. The switch apparatus according to claim 5 wherein said light emitting and light receiving elements are fixedly mounted upon a stationary member and said encoder means is displaceable, said light emitting and light receiving elements acting to scan a code pattern on said displaceable encoder means.

8. The switch apparatus according to claim 5 wherein said encoder means is stationary and said light emitting and light receiving elements are displaceable relative to said encoder means to scan said code pattern on said stationary encoder means.

9. The switch apparatus according to claim 5 wherein said code pattern is concentrically formed on said encoder means and said light emitting and light receiving elements are driven for rotation to scan said concentrically formed code pattern on said encoder means.

10. Switch apparatus according to claim 5 wherein said light emitting and light receiving elements are mounted for translational displacement relative to said encoder means to scan said code pattern formed thereon in a direction of said translational displacement.

11. Switch apparatus according to claim 1 wherein said storage means includes a read only memory.

12. The switch apparatus according to claim 1 wherein said brake means includes a braking member and an electromagnet disposed in an operative relationship with said braking member, means for normally maintaining said electromagnet in an energized condition and de-energizing said electromagnet in response to said comparison indication, said braking member being released from said electromagnet whenever the same is de-energized to apply a braking force to further scanning of selected locations on said encoder means.

13. The switch apparatus according to claim 12 wherein said braking member is disposed to abut a peripheral portion of said encoder means having said code pattern thereon to maintain said encoder means at a position corresponding to positional information.

14. The switch apparatus according to claim 12 wherein said encoder means includes a brake portion disposed for cooperation with said braking member and said braking member being disposed to abut said brake portion to hold said encoder means in a position corresponding to positional information.

15. The switch apparatus according to claim 12 additionally comprising displacement means for causing relative motion between said encoder means and said reader means, said displacement means including a brake plate thereon disposed for cooperation with said braking member, said braking member being positioned to selectively abut against said brake plate to inhibit further relative motion between said encoder and reader means and retain said encoder and reader means at a position corresponding to positional information.

16. The switch apparatus according to claim 12 wherein said reader means is provided with a displaceable support member causing displacement of said reader means, said braking member being disposed to abut said displaceable support member to hold said reader means at a position corresponding to positional information.

17. The switch apparatus according to claim 12 wherein one of said encoder and reader means is displaceable to cause relative motion therebetween, said one of said encoder and reader means being provided with engagable recesses and said braking member being provided with a projection to provide a click stop action upon said one of said encoder and reader means at a position corresponding to positional information.

* * * * *

UNITED STATES PATENT AND TRADEMARK OFFICE
CERTIFICATE OF CORRECTION

PATENT NO. : 4,318,095
DATED : March 2, 1982
INVENTOR(S) : Kenji Fukuoka

It is certified that error appears in the above—identified patent and that said Letters Patent is hereby corrected as shown below:

In the Specification, in Summary of the Invention, column 2, line 15, "information, signal" should read --information signal,--.

Column 2, line 34, "the a changing" should read --a changing--.
Column 3, Truth Table, the heading of the Table should be deleted as it appears in this printed patent, and should read as follows:

Truth Table $j/^i$

| | 1 | 2 | 3 | 4 |
|---|---|---|---|---|

UNITED STATES PATENT AND TRADEMARK OFFICE
CERTIFICATE OF CORRECTION

PATENT NO. : 4,318,095

DATED : March 2, 1982

INVENTOR(S) : Kenji Fukuoka

It is certified that error appears in the above-identified patent and that said Letters Patent is hereby corrected as shown below:

Column 8, line 43, "provide for an" should read -- provide an --.

Column 9, line 12, "round rod" should read -- round rod, --.

Signed and Sealed this

Second Day of August 1983

[SEAL]

Attest:

GERALD J. MOSSINGHOFF

Attesting Officer

Commissioner of Patents and Trademarks